United States Patent [19]

Takamatsu et al.

[11] Patent Number: 4,482,212

[45] Date of Patent: Nov. 13, 1984

[54] ELECTRODE TERMINAL ASSEMBLY ON A MULTI-LAYER TYPE LIQUID CRYSTAL PANEL

[75] Inventors: Toshiaki Takamatsu, Tenri; Fumiaki Funada, Yamatokoriyama; Shuhei Yasuda, Nara; Masataka Matsuura, Tenri, all of Japan

[73] Assignee: Sharp Kabushiki Kaisha, Osaka, Japan

[21] Appl. No.: 305,687

[22] Filed: Sep. 25, 1981

[30] Foreign Application Priority Data

Sep. 30, 1980 [JP] Japan .................................. 55-137424

[51] Int. Cl.³ .............................................. G02F 1/133
[52] U.S. Cl. ...................................... 350/334; 350/336
[58] Field of Search ................. 350/334, 335, 336; 252/511, 512, 514; 427/96

[56] References Cited

U.S. PATENT DOCUMENTS

| 3,776,615 | 12/1973 | Tsukamoto et al. | 350/333 X |
| 3,969,124 | 7/1976 | Stewart | 252/511 X |
| 3,977,767 | 8/1976 | Okuma | 350/335 X |
| 4,113,981 | 9/1978 | Fujita et al. | 252/511 X |
| 4,243,455 | 1/1981 | Shiba et al. | 350/336 X |
| 4,260,224 | 4/1981 | Takayama | 350/335 |

FOREIGN PATENT DOCUMENTS 2407738 8/1940 Fed. Rep. of Germany ...... 350/334

OTHER PUBLICATIONS

Buchoff "Metal-Elastomer Display Connector" SID 79 Digest May 9, 1979.

Primary Examiner—Bruce Y. Arnold
Assistant Examiner—David Lewis
Attorney, Agent, or Firm—Birch, Stewart, Kolasch & Birch

[57] ABSTRACT

The multi-layer liquid crystal display panel disclosed herein includes a plurality of liquid crystal layers, terminal electrodes for the respective liquid crystal layers disposed so as not to overlap each other in a plan view, and a wiring film for connecting the respective terminal electrodes. The terminal electrodes and the wiring film are bonded through infrared radiation or thermal bonding. The film is typically made of polyamide or polyester carrying a patterned conductive material.

3 Claims, 12 Drawing Figures

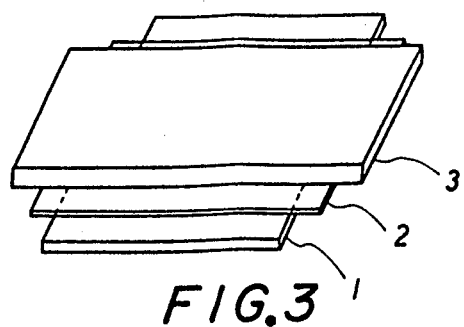
FIG.3
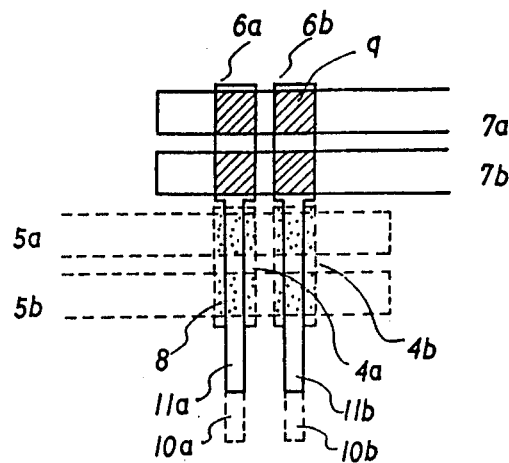
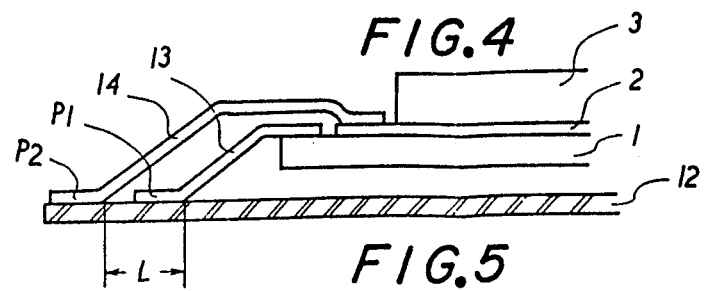
FIG.4
FIG.5

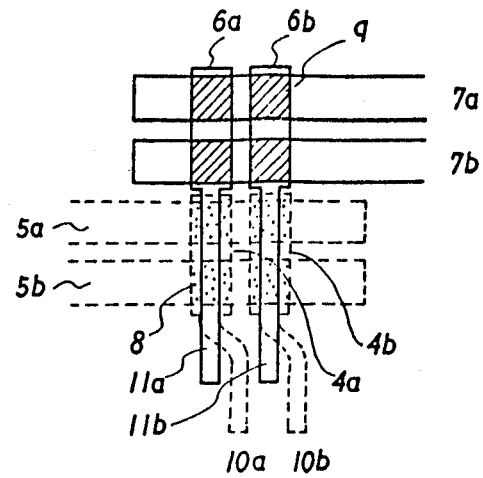
FIG. 6
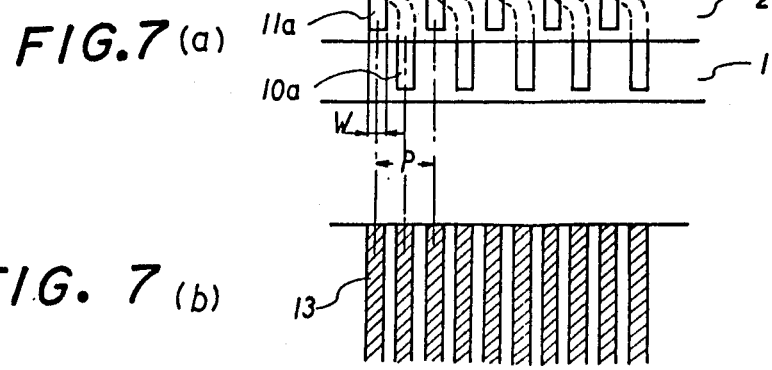
FIG. 7(a)
FIG. 7(b)
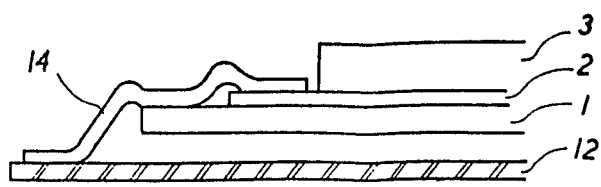
FIG. 8

ELECTRODE TERMINAL ASSEMBLY ON A MULTI-LAYER TYPE LIQUID CRYSTAL PANEL

BACKGROUND OF THE INVENTION

The invention relates to a high density intelligence display such as a matrix type liquid crystal display panel with a so-called matrix electrode structure having crossing strip electrodes, and more particularly to a terminal connection structure of such a display panel.

In recent years, a substantial amount of effort has been devoted in the field of liquid crystal matrix displays to accomplish a high-density multiline display, aiming at an improvement in image quality. Liquid crystal displays with matrix shaped electrode structures are quite favorable to fulfill a power saving demand because of their capability of being excited with low power consumption.

For the matrix type liquid crystal display panel, the greater the number of the rows (scanning line number), the higher the density and accuracy of display. However, with an increase in the number of the rows, the length of time at which a signal is applied per column, i.e., duty factor, would be shortened and the problem arises that crosstalk takes place. In particular, liquid crystal display panels show dull threshold characteristics and slow response characteristics, resulting in difficulty in assuring a satisfactory contrast. There have been several attempts to overcome the problem:

(1) The development of liquid crystal material having more definite threshold properties;

(2) A matrix address scheme in the optimum condition with an extended operating margin ($V = V_{on}/V_{off}$); and (3) The design of a new electrode layout with a higher resolution. For example, as shown in FIG. 1(a), column electrodes are divided into the upper half $Y_1, Y_2, \ldots Y_n$ and the lower half $Y_1', Y_2', \ldots Y_n'$ while line electrodes $X_1, X_2, \ldots X_m$ are operatively associated in common with the upper and lower halves. In an alternative way of FIG. 1(b) two adjacent column electrodes $Y_j$ and $Y_{j+1}$ are of a comb-teeth shape to mesh with each other within a respective one of the line electrodes $X_i$.

Although the first two methods (1) and (2) do not need modifications in the liquid crystal cell structure, it is not possible to increase, remarkably, the number of actuable line electrodes. In contrast, the last method (3) can surely obtain an increased number of actuable or useful line electrodes, for example 2, $2^2$, etc., but will suffer from complexity of cell structure.

The two-layered matrix panel will now be described in greater detail.

As more clearly, shown in FIG. 2, the two-layered matrix type comprises, in general, a first transparent support 1, a second transparent support 2 and a third support 3 disposed in the named order. While the first support 1 carries column electrodes 4a, 4b and so forth, the second support 2 carries line electrodes 5a, 5b and so forth at its upper half facing the first support 1. The second support 2 is further provided with column electrodes 6a, 6b and so forth opposite the third support 3. The third support 3 carries line electrodes 7a, 7b and so forth at its lower half. Therefore, it is possible to make such a multi-layered panel by stacking the glass supports in this manner.

Moreover, with the multi-layered panel it is possible to increase the number of actual lines 2, $2^2$, etc. times while increasing the number of the column electrodes, 2, $2^2$ times, etc. This results in a remarkable increase in the terminal electrodes and difficulty in connecting the terminal electrodes through the use of commercially available connectors, electrode pins, etc., especially because of a stepped terminal structure of the multi-layered panel.

The conventional terminal assembly is now discussed with reference to FIG. 3 illustrating a perspective view of a two-layered structure liquid crystal panel. When matrix displaying is desired through the use of this panel, the column electrodes 4a, 4b and so forth of the first layer overlap with those 6a, 6b and so forth of the second layer as shown in FIG. 4 wherein picture elements 8 are ones appearing on the first layer and picture elements 9 are ones appearing on the second layer. Terminal electrodes are led from the respective column electrodes and especially the terminal electrodes 10a, 10b and so forth of the first layer overlap with those 11a and 11b of the second layer. With the above stepped terminal assembly, a wiring film 13 and 14 as shown in FIG. 5 is needed for each of the respective layers and a great difficulty is faced in drastically decreasing the distance L between connection pads $P_1$ and $P_2$ on circuit boards to which the two wiring films 13 and 14 are respectively connected. To this end the problem remains outstanding that the liquid crystal panel including its drive circuit is bulky and voluminous.

OBJECT AND SUMMARY OF THE INVENTION

It is therefore an object of the present invention to provide an improved terminal structure of a liquid display panel.

It is a further object of the present invention to provide an improved liquid crystal display panel by which the above discussed problems are overcome by aligning terminal electrodes of respective layers in nonoverlapping relationship.

BRIEF DESCRIPTION OF THE DRAWINGS

For a more complete understanding of the present invention and for further objects and advantages thereof, reference is now made to the above and following description taken in conjunction with the accompanying drawings, in which:

FIG. 3 is a perspective view of a two-layer panel;

FIG. 4 is a layout of a conventional terminal electrode assembly in the two-layered panel;

FIG. 5 shows a way to process stepped terminals of the two-layered panel;

FIG. 6 is a layout of a terminal electrode assembly of a two-layered panel according to an embodiment of the present invention;

FIGS. 7(a) and 7(b) are enlarged views showing terminals of the two-layered panel and a view showing electrodes of a wiring film;

FIG. 8 is a view for explaining how to connect terminal electrodes of the two-layered panel through the use of a single wiring film;

DETAILED DESCRIPTION OF THE INVENTION

The discussions of FIGS. 1-5 has been presented above.

FIG. 6 illustrates a terminal assembly of a two-layered structure liquid crystal display panel according to an embodiment of the present invention. To connect terminals through the use of a single flexible wiring film, terminal electrodes of the first layer structure and those of the second layer structure are aligned and bent not to overlap with each other. The terminal electrodes 10a, 10b and so forth of the first layer structure lie sandwiched between the two adjoining terminal electrodes 11a and 11b of the second layer structure. The terminal electrodes of the two-layered panel are shown in FIG. 7(a) and electrodes on the wiring film are shown in FIG. 7(b). It is also necessary to pay attention to the width W of the respective terminal electrodes in order to avoid overlap between the terminal electrodes of the first and second layer structures. In other words, provided that the width W of the terminal electrodes is too wide, the terminal electrodes of the first layer structure will overlap those of the second layer structure. Such overlap of the terminal electrodes can be avoided by selecting the width of the respective terminal electrodes to be nearly P/4 where P is the pitch of the respective terminal electrodes. The electrodes on the wiring film, on the other hand, are selected to be substantially equal to the width W of the electrodes of the panel.

FIG. 8 depicts a way to connect the electrodes (including the bent electrodes) on the panel through the use of a single flexible wiring film and connect the opposite end of the wiring film to a circuit board 12.

Figure 1:
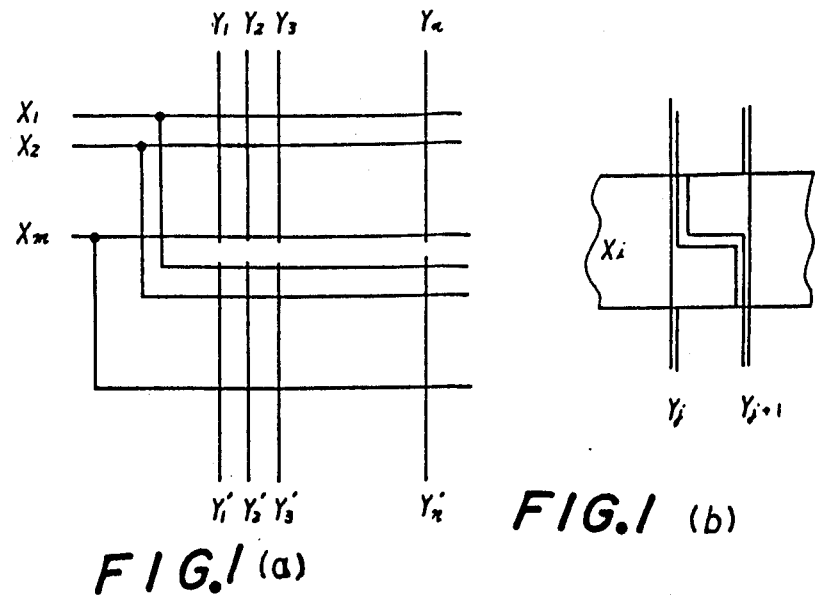
FIG. 1(a) is a view for explanation of a vertical electrode division system.
FIG. 1(b) is a view for explanation of a double electrode system.
Figure 2:
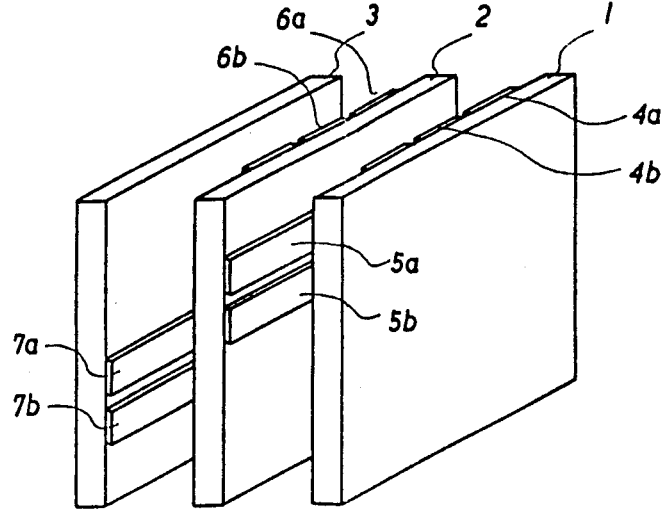
FIG. 2 is a view for explanation of a two-layer matrix system.
Figure 9:
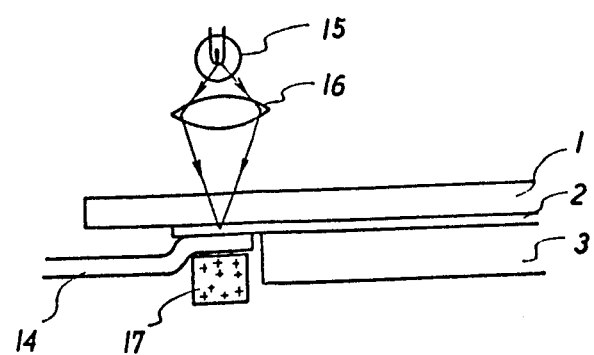
FIG. 9 is a view showing infrared heating for bonding a polyamide wiring film on the panel.
Figure 10:
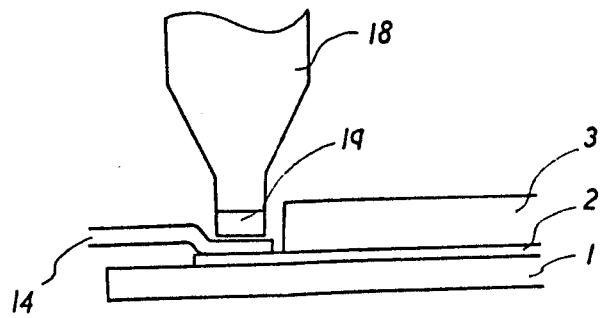
FIG. 10 is a view showing pressure heating for thermal bonding the wiring film on the panel.

It is preferred that the flexible wiring film comprise a polyamide wiring film carrying copper foils or a heatproof film of polyester or the like carrying a conductive material pattern of carbon or the like and a nonconductive material pattern of a thermo-plastic resin with both patterns being formed by printing. The former will first be described with reference to FIG. 9. A thin coating of solder is disposed on either or both sides of the terminal electrode 14 on the panel side and the electrode 17 of the polyamide wiring film and, subsequent to pattern alignment, melted for bonding thereof by infrared radiations via source 15 and lens 16, or the like. As is clear from FIG. 9, the terminal electrodes on the first layer structure are connected after connection of the second layer structure is completed. The following will set forth an alternative way or the use of the polyester film carrying the carbon pattern and the thermo-plastic resin pattern. The patterned polyester film is made by the use of a mixture of carbon as electrically conductive material, chloroprene rubber or a thermo-plastic resin such as polyurethane resin as a fixing agent and dimethylforamide or dimethylacetamide as a binder. To reduce electrode resistance, an electrically conductive material such as silver powder may be printed as a lining and the carbon pattern is formed thereon. Another preferred insulating material is a mixture of fine powder of iron oxide and toluene or ethyl acetate as a binder. The wiring film is easily bonded by heating the same under pressure from above through the use of a heater 18 and header as shown in FIG. 10. The first layer structure is wired after connections of the first layer structure is completed.

Although the foregoing has shown and described the two-layered structure panel, it is obvious that the present invention is equally applicable to panels having three or more layers whereby the terminal electrodes are bent so as not to overlap with each other to thereby make possible connecting the terminal electrodes through the use of the single flexible film.

The invention being thus described, it will be obvious that the same may be varied in many ways. Such variations are not to be regarded as a departure from the spirit and scope of the invention, and all such modifications are intended to be included with the scope of the following claims.

What is claimed is:

1. A display device comprising:
 a matrix type liquid crystal display panel including a plurality of liquid crystal layers having crossing strip electrodes,
 terminal electrodes for each of said liquid crystal layers, disposed so as not to overlap each other, said terminal electrodes having a pitch P and each terminal electrode having a width W, the width W of the terminal electrodes being equal to P/4, and
 a single flexible wiring film comprising electrodes for connecting to said terminal electrodes said wiring film electrodes having a width being substantially equal to said width W, the width of the terminal electrodes.

2. A display device as set forth in claim 1, wherein said wiring film comprises a polyamide film carrying copper foils.

3. A display device as set forth in claim 1, wherein said wiring film comprises said electrodes which comprise a polyester film carrying a conductive material pattern of carbon, and a thermoplastic non-conductive material pattern.

* * * * *